United States Patent
Atalar et al.

(10) Patent No.: US 6,263,229 B1
(45) Date of Patent: Jul. 17, 2001

(54) MINIATURE MAGNETIC RESONANCE CATHETER COILS AND RELATED METHODS

(75) Inventors: Ergin Atalar, Columbia; Jeffrey C. Lestio, Brookville; Harry K. Charles, Jr.; Bliss G. Carkhuff, both of Laurel; Paul A. Bottomley, Columbia, all of MD (US)

(73) Assignee: Johns Hopkins University School of Medicine, Baltimore, MD (US)

( * ) Notice: Subject to any disclaimer, the term of this patent is extended or adjusted under 35 U.S.C. 154(b) by 0 days.

(21) Appl. No.: 09/191,563

(22) Filed: Nov. 13, 1998

(51) Int. Cl.[7] .................................................. A61B 5/055
(52) U.S. Cl. ........................... 600/423; 324/318; 324/322
(58) Field of Search .................................... 600/410, 422, 600/423; 324/307, 309, 318, 322; 29/602.1

(56) References Cited

U.S. PATENT DOCUMENTS

| 4,431,005 | 2/1984 | McCormick | 128/656 |
| 4,445,501 | 5/1984 | Bresler | 128/1.5 |
| 4,572,198 | 2/1986 | Codrington | 128/653 |

(List continued on next page.)

FOREIGN PATENT DOCUMENTS

| 6-70902 | 3/1994 | (JP) . |
| WO 98/52461 | 11/1998 | (WO) . |

OTHER PUBLICATIONS

Kantor et al., In vivo [31]P Nuclear Magnetic Resonance Measuremetns in Canine Heart Using a Catheter–Coil Circulation Research, Aug. 1984, pp. 261–266, vol. 55, No. 2 (USA).

(List continued on next page.)

*Primary Examiner*—Marvin M. Lateef
*Assistant Examiner*—Eleni Mantis Mercader
(74) *Attorney, Agent, or Firm*—Foley Hoag & Eliot, LLP (57) ABSTRACT

The present invention provides several embodiments of methods of making magnetic resonance catheter coils which include employing a flexible electrically insulative base member, depositing an electrically conductive material on the base member in a predetermined pattern to create at least one pair of generally parallel electrically conductive coil elements which are electrically connected to each other. A catheter is provided over the coil assembly. In one embodiment, a second pair of generally parallel electrically conductive coil elements are provided in order to create a quadrature coil. In this latter embodiment, the electrically insulative base member may have the first pair of coil elements created on one surface thereof and a second pair on the other with the base member subsequently being deformed to create a tubular coil having one pair of coil elements on the outside and the other pair on the inside. In some embodiments, tuning and matching circuits and decoupling circuits may be provided. The (a) coils, (b) coil assemblies, as well as (c) catheter coils containing coil assemblies produced by these methods are also disclosed. The coils may be miniaturized so as to facilitate ready insertion within a suitable sheath, such as a probe or catheter, into a patient, including into body openings, or into blood vessels or into interior regions of the body.

63 Claims, 8 Drawing Sheets

U.S. PATENT DOCUMENTS

| | | | |
|---|---|---|---|
| 4,672,972 | 6/1987 | Berke . | |
| 4,766,381 | 8/1988 | Conturo et al. . | |
| 4,791,372 | 12/1988 | Kirk et al. | 324/318 |
| 4,793,356 | 12/1988 | Misic et al. | 128/653 |
| 4,823,812 | 4/1989 | Eshel et al. | 128/804 |
| 4,897,604 * | 1/1990 | Carlson et al. | 324/318 |
| 4,922,204 | 5/1990 | Duerr et al. | 324/322 |
| 4,932,411 | 6/1990 | Fritschy et al. . | |
| 4,960,106 | 10/1990 | Kubokawa | 128/6 |
| 5,050,607 | 9/1991 | Bradley et al. | 128/653 A |
| 5,099,208 | 3/1992 | Fitzpatrick et al. | 324/312 |
| 5,167,233 | 12/1992 | Eberle et al. | 128/662.06 |
| 5,170,789 | 12/1992 | Narayan et al. . | |
| 5,211,165 | 5/1993 | Dumoulin et al. | 128/653.1 |
| 5,217,010 | 6/1993 | Tsitlik et al. | 128/419 PG |
| 5,260,658 | 11/1993 | Greim et al. | 324/322 |
| 5,270,485 | 12/1993 | Jacobsen | 174/15.1 |
| 5,271,400 | 12/1993 | Dumoulin et al. . | |
| 5,294,886 | 3/1994 | Duerr | 324/318 |
| 5,307,808 | 5/1994 | Dumoulin et al. . | |
| 5,307,814 | 5/1994 | Kressel et al. | 128/653.5 |
| 5,318,025 | 6/1994 | Dumoulin et al. | 128/653.2 |
| 5,323,778 | 6/1994 | Kandarpa et al. | 128/653.2 |
| 5,348,010 | 9/1994 | Schnall et al. | 128/653.2 |
| 5,355,087 | 10/1994 | Claiborne et al. | 324/322 |
| 5,358,515 | 10/1994 | Hürter et al. | 607/101 |
| 5,365,928 | 11/1994 | Rhinehart et al. | 128/653.5 |
| 5,370,644 | 12/1994 | Langberg | 606/33 |
| 5,375,596 | 12/1994 | Twiss et al. | 128/653.1 |
| 5,400,787 | 3/1995 | Marandos | 128/653.5 |
| 5,413,104 | 5/1995 | Buijs et al. | 128/653.5 |
| 5,419,325 | 5/1995 | Dumoulin et al. | 128/653.2 |
| 5,429,132 | 7/1995 | Guy et al. | 128/653.1 |
| 5,435,302 * | 7/1995 | Lenkinski et al. | 128/653.5 |
| 5,437,277 | 8/1995 | Dumoulin et al. | 128/653.1 |
| 5,443,066 | 8/1995 | Dumoulin et al. | 128/653.1 |
| 5,443,489 | 8/1995 | Ben-Haim | 607/115 |
| 5,447,156 | 9/1995 | Dumoulin e tal. | 128/653.2 |
| 5,451,232 | 9/1995 | Rhinehart et al. | 606/192 |
| 5,451,774 | 9/1995 | Jacobsen | 250/227.24 |
| 5,462,055 | 10/1995 | Casey et al. | 128/653.5 |
| 5,476,095 | 12/1995 | Schnall et al. | 128/653.2 |
| 5,498,261 | 3/1996 | Strul | 606/29 |
| 5,507,743 | 4/1996 | Edwards et al. | 606/41 |
| 5,512,825 | 4/1996 | Atalar et al. | 324/309 |
| 5,520,644 | 5/1996 | Imran | 604/95 |
| 5,524,630 | 6/1996 | Crowley | 128/662.06 |
| 5,558,093 | 9/1996 | Pomeranz | 128/660.03 |
| 5,588,432 | 12/1996 | Crowley | 128/660.03 |
| 5,623,241 | 4/1997 | Minkoff | 335/296 |
| 5,682,897 | 11/1997 | Pomeranz | 128/662.06 |
| 5,699,801 | 12/1997 | Atalar et al. . | |
| 5,715,825 | 2/1998 | Crowley | 128/602.06 |
| 5,728,079 | 3/1998 | Weber et al. | 604/280 |
| 5,775,338 | 7/1998 | Hastings | 128/898 |
| 5,792,055 | 8/1998 | McKinnon | 600/410 |
| 5,840,031 | 11/1998 | Crowley | 600/440 |
| 5,868,674 | 2/1999 | Glowinski et al. | 600/410 |
| 5,928,145 | 7/1999 | Ocali et al. | 600/410 |
| 5,938,609 | 8/1999 | Pomeranz | 600/439 |
| 5,938,692 | 8/1999 | Rudie | 607/101 |
| 5,964,705 | 10/1999 | Truwit et al. | 600/423 |
| 6,004,269 | 12/1999 | Crowley et al. | 600/439 |
| 6,026,316 | 2/2000 | Kucharczyk et al. | 600/420 |
| 6,031,375 | 2/2000 | Atalar et al. | 324/307 |
| 6,032,078 | 2/2000 | Rudie | 607/101 |
| 6,051,974 | 4/2000 | Reisker et al. | 324/318 |
| 6,104,943 * | 8/2000 | Frederick et al. | 600/410 |

OTHER PUBLICATIONS

Merickel et al., *ndentification and 3–d Quantification of Atherosclerosis Using Magnetics Resonance Imaging*, Comput. Biol. Med., 1988, pp. 89–102, vol. 18, (Great Britain).

Maynor et al., *Chemical Shift Imaging of Atherosclerosis at 7.0 Telsa*, Investigative Radiology, Jan. 1989, pp. 52–60, vol. 24, No. 1.

Mohiaddin et al., *Chemical Shift Magnetic Resonance Imaging of Human Atheroma*, Br. Heart J., 1989, pp. 81–89, vol. 62 (England).

Asdente et al., *Evaluation of Atherosclerotic Lesions Using NMR Microimaging*, Atherosclerosis, 1990, pp. 243–253 vol. 80 (Italy).

Vinitski et al., *Magnetic Resonance Chemical Shift Imaging and Spectroscopy of Atherosclerotic Plaque*, Investigative Radiology, Aug. 1991, pp. 703–747, vol. 26.

Pearlman et al., *Nuclear Magnetic Resonance Microscopy of Atheroma in Human Coronary Arteries*, Angiology, Sep. 1991, pp. 726–733, vol. 42 (USA).

Martin et al., *MR Imaging of Blood Vessel with an Intravascular Coil*, J. Magn. Reson. Imaging, 1992, pp. 421–429, vol. 2.

Waller et al., *Intravascular Ultrasound: A hoistological Study of Vessel During Life*, Circulation, Jun. 1992, pp. 2305–2310, vol. 85.

Hurst et al., *Intravascular (Catheter) NMR Receiver Probe: Preliminary Design Analysis and Application to Canine Iliofemoral Imaging*Magn. Resonance in Medicine, Apr. 1992, pp. 343–357, vol. 24.

Dumoulin et al., *Real–Time Position Monitoring of Invasive Devices Using Magnetic Resonance*, Magnetic Resonance in Medicine, Mar. 1993, pp. 411–415, vol. 29.

Koechli et al., *Catheters and Guide Wires for Use in an Echo–Planar MR Fluoroscopy System*, R. 79th Scientific Meeting, editor, Radiology, Nov. 1993, p. 319, vol. 189(P).

McDonald et al., *Performance Comparison of Several Coil Geometries for Use in Catheters* (Abstract), R. 79th Scientific Meeting, editor, Radiology, Nov. 1993, p. 319, vol. 189(P).

Merickel et al., *Noninvasive Quantative Evaluation of Ather.sclerosis Using MRI and Image Analysis*, Arteriosclerosis and Thrombosis, 1993, pp. 1180–1186, vol. 13.

Spears et al.,*In Vivo coronary Angioscopy*, Journal of the American Colege of Cardiology, May 1993, pp. 1311–1314, vol. 1 (USA).

Yuan et al., *Techniques for High–Resolution MR Imaging Of Atherosclerotic Plaque*, J. Magnetic Resonance Imaging, 1994, pp. 43–49, vol. 4, No. 1.

Martin et al., *Intravascular MR Imaging in a Porcine Animal Model*, Magn. Resonance in Medicine, Aug. 1994, pp. 224–229, vol. 32.

Atalar et al.; "High Resolution Intravascular MRI and MRS using a Catheter Receiver Coil, ", Magnetic Resonance in Medicine, 63:596–605 (1996).

Edelman et al.; "Magnetic Resonance Imaging" NEJM. 328: 708–716 (1993).

Farmer et al., "Implanted Coil MR Microscopy of Renal-Pathology", Magn. Reson. Med., 10: 310–323 (1989).

Garwood et al.; "Magnetic Resonance Imaging with Adiabatic Using a Single Surface Coil for RF Transmission and Signal Detection", Magnetic Resonance in Medicine 9: 25–34 (1989).

Hoult et al.; "The Signal–to–Noise Ratio of the Nuclear Magnetic Resonance Experiment" J. Magn. Reson., 24: 71–85 (1976).

Hoult; "Rotating Frame Zeugmatography", Phil. Trans. R. Soc. Lond. B. 289: 543–547 (1980).

Jolesz et al.; "Interventional Magnetic Resonance Therapy", Seminars in Interventional Radiology, 12: 20–27 (1995).

Ocali et al.; "Intravascular Magnetic Resonance Imaging Using a Loopless Catheter Antenna", MRM, 37: 112–118 (1997).

* cited by examiner

MINIATURE MAGNETIC RESONANCE CATHETER COILS AND RELATED METHODS

BACKGROUND OF THE INVENTION

1. Field of the Invention

The present invention relates to a method of making magnetic resonance catheter coils employing printed electrical circuit board technology and the flexible catheter coils made therefrom and, more specifically, it relates to miniaturized coils which are sufficiently small as to be insertable into body passageways such as blood vessels, body cavities and the like.

2. Description of the Prior Art

The advantageous use of magnetic resonance technology in providing safe, rapid images of a patient has long been known. It has also been known to employ magnetic resonance technology in producing chemical shift spectra to provide information regarding the chemical content of a material.

In a general sense, magnetic resonance imaging involves providing bursts of radio frequency energy on a specimen positioned within a main magnetic field in order to induce responsive emission of magnetic radiation from the hydrogen nuclei or other nuclei. The emitted signal may be detected in such a manner as to provide information as to the intensity of the response and the spatial origin of the nuclei emitting the responsive magnetic resonance signal. In general, imaging may be performed in a slice or plane or multiple planes or three-dimensional volume with information corresponding to the responsively emitted magnetic radiation being received by a computer which stores the information in the form of numbers corresponding to the intensity of the signal. The image pixel value may be established in the computer by employing Fourier Transformation which converts the signal amplitude as a function of time to signal amplitude as a function of frequency and position. The signals may be stored in the computer and may be delivered with or without enhancement to a video screen display, such as a cathode-ray tube, for example, wherein the image created by the computer output will be presented through black and white presentations varying in intensity or color presentations varying in hue and intensity. See, generally, U.S. Pat. No. 4,766,381.

U.S. Pat. No. 5,170,789 discloses an MR coil probe that is said to be insertable within a specimen, which has an opening, for purposes of nuclear magnetic resonance spectroscopy. It also discloses the use of a probe in the nature of an endoscope. The two component probe has a portion which is insertable into the body cavity and an external portion. As the tuning and matching circuit is outside the body, this limits the permitted extent of insertion into the body. Also, the coil has an elliptical or circular shape that may deform during insertion and, as a result, require that the coil be tuned after insertion. If the coil were made of a very rigid material, insertion problems would also occur. A further limitation of this disclosure is that the coil axis cannot be placed parallel to the direction of the main magnetic field, (denoted herein as the z-axis) otherwise, it would have a practically zero sensitivity. Finally, the coil has no receive-only mode and, as a result, limits its application to spectroscopy. See, also, U.S. Pat. Nos. 4,932,411 and 4,672,972 which have the same inadequacies as the system in U.S. Pat. No. 5,170,789.

U.S. Pat. No. 4,932,411 discloses a solenoidal RF coil which is insertable into the body. The coil, while not disclosed in great detail, is generally similar to the coil of U.S. Pat. No. 5,170,789 except that a solenoidal coil is used instead of a single turn coil.

U.S. Pat. No. 4,672,972 discloses an NMR probe disposed at the distal end of a catheter or endoscope for obtaining NMR spectra from within a patient. The multi-turn probe has a parametric amplifier and/or a gate-array attached to it and also has a coil cooling system. The small parametric preamplifier and the gate-array could tend to create a significant amount of electrical noise to the received signal and, thereby, reduce its sensitivity.

U.S. Pat. No. 5,271,400 discloses the use of an MR active specimen placed in an RF coil within a catheter. The frequency of the signal received by the coil provides information as to the position of the coil. It is not employed to provide MR imaging and spectroscopic analysis. U.S. Pat. No. 5,307,808 has a similar disclosure which employs the signal coming from the surrounding tissue.

One of the beneficial uses of the present invention is in connection with atherosclerotic disease which is a major cause of mortality and morbidity in the United States. Localized forms of the disease, such as the deposit of plaque in the walls of blood vessels, can restrict local blood flow and require surgical intervention in some instances. While x-ray angiography is an established means for detecting the luminal narrowing caused by plaque, it does not provide information regarding the structure of the stenoses nor nature of the process leading to blood flow reduction. Unfortunately, therapeutic methods, such as intravascular intervention, may experience failure partially due to the lack of valid animal models and lack of sufficiently precise imaging methods. An imaging system capable of providing detailed, qualitative and quantitative data regarding the status of vascular walls at the time of surgical intervention, could favorably influence the outcome by enabling the selection of the intervention method to be customized to the particular need. It would also serve to provide precise guidance for various forms of localized therapy.

It has been known to use angioplasty and intravascular ultrasound for imaging plaques. See, generally, Spears et al., "In Vivo Coronary Angioscopy," Journal of the American College of Cardiology, Vol. 1, pp. 395–399 (May, 1993), and Waller et al., "Intravascular Ultrasound: A Histological Study of Vessel During Life," Circulation, Vol., 85, pp. 2305–2310 (1992). Intravascular ultrasound, however, provides several drawbacks, including the insensitivity to soft tissue and the inability to reliably detect thrombus and discriminate thrombus (new or organized) superimposed upon plaque from soft lipid-laden plaques. Also, the presence of artifacts related to transducer angle relative to the vessel wall, calcification of stenoses, and an imaging plane limited to the aperture of the transducer in variable resolution at different depths of view are further problems with this approach.

The feasibility of identification of atherosclerotic lesions by employing MR microimaging in vitro has previously been suggested. See, for example, Pearlman et al., "Nuclear Magnetic Resonance Microscopy of Atheroma in Human Coronary Arteries," Angiology, Vol. 42, pp. 726–733 (1991); Asdente et al., "Evaluation of Atherosclerotic Lesions Using NMR Microimaging," Atherosclerosis, Vol. 80, pp. 243–253 (1990); and Merickel et al., "Identification and 3-d Quantification of Atherosclerosis Using Magnetic Resonance Imaging," Comput. Biol. Med., Vol. 18, pp. 89–102 (1988).

It has also been suggested that MRI can be used for quantification of atherosclerosis. See, generally, Merickel et al., "Noninvasive Quantitative Evaluation of Atherosclerosis Using MRI and Image Analysis," Arteriosclerosis and Thrombosis, Vol. 13, pp. 1180–1186 (1993).

Yuan et al, "Techniques for High-Resolution MR Imaging of Atherosclerotic Plaques,"J. Magnetic Resonance Imaging, Vol. 4, pp. 43–49 (1994) discloses a fast spin echo MR imaging technique to image atherosclerotic plaques on an isolated vessel that has been removed by carotid endarterectomy. As the signal-to-noise ratio (SNR) decreases with the decrease in imaging time and increase in spatial resolution, special RF receiver coils were designed. The article suggests that by the use of special MR hardware at 1.5 T using various T1 and T2-weighted pulse sequences, it is possible to discriminate foam cells, fibrous plaque organized thrombus, new thrombus, loose necrosis and calcium.

It has also been suggested that the fat content of atherosclerotic plaque in excised tissue samples can be determined using chemical shift imaging or chemical shift spectroscopy. See, generally, Vinitski et al., "Magnetic Resonance Chemical Shift Imaging and Spectroscopy of Atherosclerotic Plaque," Investigative Radiology, Vol. 26, pp. 703–714 (1991), Maynor et al., "Chemical Shift Imaging of Atherosclerosis at 7.0 Tesla," Investigative Radiology, Vol. 24, pp. 52–60 (1989), and Mohiaddin et al., "Chemical Shift Magnetic Resonance Imaging of Human Atheroma," Br. Heart J., Vol. 62, pp. 81–89 (1989).

The foregoing prior art articles in the aggregate could lead one skilled in the art to conclude that MR, while having potential for fully characterizing vessel wall disease, suffers from low anatomic resolution unless used in vitro on small specimens with high resolution methods.

MR compatibility characteristics of various catheter and guide wire systems for use in interventional MR procedures, has been considered. See Dumoulin et al., "Real-time Position Monitoring of Invasive Devices Using Magnetic Resonance," Magnetic Resonance in Medicine, Vol. 29, pp. 411–415 (Mar. 1993) and Koechli et al., "Catheters and Guide Wires for Use in an Echo-Planar MR Fluoroscopy System," R. 79th Scientific Meeting, editor, Radiology, Vol. 189 (P), p. 319 (Nov. 1993). It is known that in order to obtain the desired high-resolution imaging and spectroscopy of arteriosclerotic plaques, a coil must be placed close to the target blood vessel.

In Kantor et al., "In vivo $^{31}$P Nuclear Magnetic Resonance Measurements in Canine Heart Using a Catheter-Coil," Circulation Research, Vol. 55, pp. 261–266 (Aug. 1984), there is disclosed an effort to improve the signal-to-noise ratio in the $^{31}$P spectroscopy of a dog myocardium using an elliptical coil. This coil is rigid and rather bulky. Further, as it was designed for spectroscopy of the myocardium, it is not ideal for blood vessels.

Disclosures of efforts to develop catheter coils for imaging vessel walls are contained in Martin et al., "MR Imaging of Blood Vessel with an Intravascular Coil," J. Magn. Reson. Imaging, Vol. 2, pp. 421–429 (1992) and Hurst et al., "Intravascular (Catheter) NMR Receiver Probe: Preliminary Design Analysis and Application to Canine Iliofemoral Imaging," Magn. Reson. Med., Vol. 24, pp. 343–357 (Apr. 1992). These disclosures employ two tiny diameter, back-to-back solenoid coils to produce a good axial profile when the coils are placed along the main magnetic field. The magnetic fields detected by these coils are perpendicular to the long axis of the catheter.

Martin et al., "Intravascular MR Imaging in a Porcine Animal Model," Magn. Reson. Med., Vol. 32, pp. 224–229 (Aug. 1994) discloses use of the system disclosed in the above-cited Martin et al. article for high-resolution images of live animals. See, also, Abstract, McDonald et al., "Performance Comparison of Several Coil Geometries for Use in Catheters," R. 79th Scientific Meeting, editor, Radiology, Vol. 189(P) p. 319 (Nov. 1993). A strong disadvantage of these disclosures is that multislice acquisition cannot be carried out because the longitudinal coverage of the sensitive regions is limited to a few millimeters. Also, these designs require, in order to function effectively, that the long axis of the coils be parallel to the main magnetic field. Unfortunately, for most vessels of interest, such as coronary arteries or veins, for example, the vessels are tortuous and oblique to the magnetic field. Further, to the extent that the coil itself does not have desired flexibility while maintaining the desired efficiency of data acquisition, they are also unsuitable for the purposes of the present invention.

U.S. Pat. No. 5,699,801, assigned to the assignee of the present application, discloses a number of embodiments of flexible coils insertable within small blood vessels of a patient and useful in magnetic resonance imaging and spectroscopic analysis. The coil may be incorporated into an invasive probe and may be introduced into or positioned adjacent to the specimen to be evaluated. The coil may function as a receiver coil having a pair of elongated electrical conductors disposed within an dielectric material and having a pair of ends electrically connected to each other. Associated processing means are disclosed. The disclosure of this patent is expressly incorporated herein by reference.

There remains, therefore, a very real and substantial need for an improved means for MR imaging and spectroscopic analysis of specimens in a manner which provides efficient data acquisition with maximum SNR while permitting in vivo or in vitro acquisition from small vessels, as well as other body openings and a wide range of other types of specimens.

SUMMARY OF THE INVENTION

It is an object of the invention to provide catheter coils employable in magnetic resonance imaging and spectroscopic analysis wherein the coils are formed on flexible circuit boards.

It is a further object of the present invention to provide such methods of manufacture which facilitate mass production of such catheter coils in an economical and precise manner.

It is a further object of the invention to provide such a method and coils produced thereby which are flexible and sufficiently small as to be placed within blood vessels or other cavities including the esophagus, bile ducts, rectum, aortas, urethrum, bronchi, nasal cavities, vaginas, and ears of a patient.

It is a further object of the invention to provide such a method and resultant coils which may be manufactured employing printed circuit board miniaturization technology.

It is a further object of the present invention to provide such a method of manufacturing such miniaturized coils which can provide high resolution images of blood vessels and have a high signal-to-noise ratio.

It is a further object of the invention to provide highly reproducible coil inductance in miniaturized magnetic resonance catheter coils.

It is a further object of the invention to provide such a method and resultant miniaturized coil which may be manufactured by mass production procedures in a reliable manner.

It is a further object of the present invention to provide a method of making magnetic resonance coils on an economic basis such that the coils are disposable.

These and other objects of the invention will be more fully understood from the following description of the invention on reference to the drawings appended hereto.

DESCRIPTION OF THE PREFERRED EMBODIMENTS

The present invention has met the above described need.

As used herein, the term "specimen" shall refer to any object placed in the main magnetic field for imaging or spectroscopic analysis and shall expressly include, but not be limited to members of the animal kingdom, including humans, test specimens, such as biological tissue, for example, removed from such members of the animal kingdom and inanimate objects which may be imaged by magnetic resonance techniques or contain water or sources of other sensitive nuclei.

As used herein, the term "patient" shall mean human beings and other living members of the animal kingdom.

As used herein, the term "body opening" shall refer to preformed passageways of a patient within which a coil of the present invention is insertable with or without surgical intervention to effect access. Such body openings shall expressly include blood vessels, the esophagus, bile ducts, rectal passageways, aortas, urethras, ears, nostrils, vaginas and bronchi.

Figure 1:
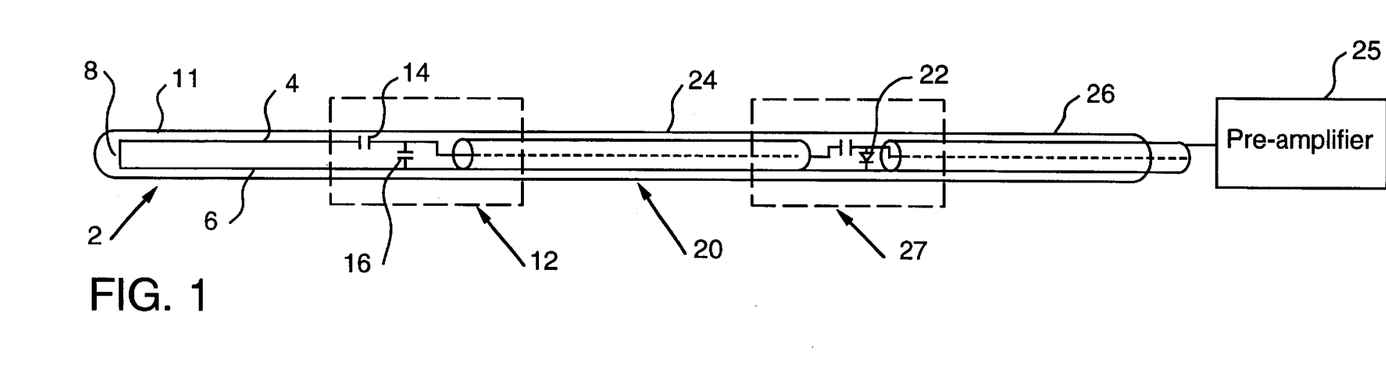
FIG. 1 is a circuit diagram of a form of coil assembly which may be made by the present invention.
Figure 1A:
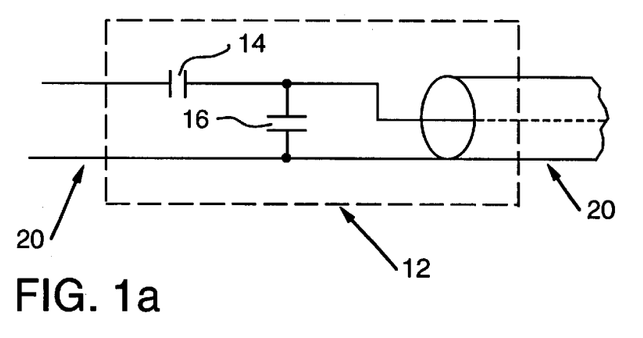
FIGS. 1a and 1b show circuit details of dashed boxes of FIG. 1.
Figure 1B:
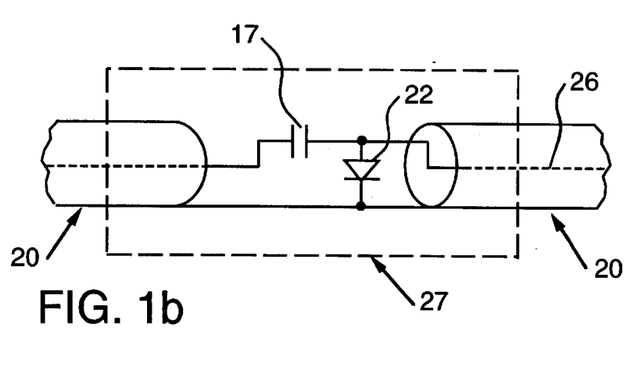

FIGS. 1, 1a, and 1b illustrates a circuit diagram for a catheter coil which may function electrically in a manner identical to that disclosed in U.S. Pat. No. 5,699,801 in FIG. 5A thereof, but in the present invention would employ the new method of making a miniaturized coil and the resultant coil. The coil 2 consists of two coil elements 4, 6 having the ends electrically connected by an electrically conductive material 8. The miniaturized coil 2 is formed in accordance with the present invention employing printed circuit technology in a manner to be described hereinafter. For appropriate tuning and matching, at the time of manufacture, tuning/matching circuit 12 will be connected electrically to the ends of coil elements 4 and 6. The tuning and matching circuit 12 has a pair of capacitors 14, 16 which are electrically connected to coil 2. The other end of the tuning/matching circuit 12 is connected to coaxial cable 20 which is adapted to transport the magnetic resonance signal received by the coil 2 to processor means (not shown). A catheter 17 and a pin diode device 22 are placed in the coaxial cable 20 between segments 24 and 26 at box 27 in order to facilitate decoupling. The coil 2, tuning/matching circuit 12, coaxial cable 20, and pin diode decoupling device 22 will be referred to collectively herein as the "coil assembly." When the coil assembly is embedded within a catheter, it will be referred to as a "catheter coil." The pin diode device 22 turns on during RF transmission using DC current applied by the scanner hardware. The coaxial cable 20 is provided for connection with the MR systems preamplifier 25 with a predetermined length 24 between the tuning/matching circuit 12 and the pin diode device 22 such that the diode device 22 is on the coaxial cable 20 and acts like an inductor and resonates with capacitor 16 to disable a current through the receiver coil 2. In the decoupling circuit 25, which includes capacitor 17 and pin diode device 22, in order to resist current induction in the receiver coil 2 during RF transmission, the magnetic resonance scanner may provide a positive DC pulse to coil 2 for this purpose. This would normally turn on pin diode device 22. When the pin diode device 22 is on, negligible current from the coil 2 is allowed to pass.

In order to provide for ready mass production of miniaturized magnetic resonance coils, the use of printed circuit board technology facilitates reliable and economical manufacture. The coils so made may be used to send, to receive, or to both send and receive. The coils may be manufactured employing general printed circuit technology wherein a flexible circuit board made of a suitable, flexible, electrically insulative material, such as a polyimide (such as that sold under the trade designation "Kapton" by DuPont or polytetrafluoroethylene sold under the trade designation "Teflon" by DuPont) is used. In making printed circuit boards, the desired electrically conductive circuit is established by any of several means which may include etching techniques, electroplating, the use of electrically conductive inks or other suitable means. Conventional photolithographic techniques may be employed in creating the coil on the flexible circuit board, if desired. Electronic components, such as capacitors, diodes, active components, and the like, may be secured in electrical contact with the conductive coil elements at the desired positions within the printed circuit boards by known automated means. The electrically conductive portion may consist of copper or copper with silver coating or other electrically conductive materials. This technique may permit production of very small coils which may have a width or maximum dimension on the order of about 1 mm. The coil assembly may be inserted into a suitable sheath, such as a probe or catheter, in accordance with the teaching of U.S. Pat. No. 5,699,801 or in another desired surrounding housing for introduction into a patient or a patient's body opening. The catheter, which may be made of a resinous plastic receiving the coil assembly, is identified generally by the reference number 11 in FIG. 1.

The miniaturized coils produced by the method of this invention may be employed with conventional magnetic resonance imaging equipment, computerized processing equipment, conventional probes and catheters suitably dimensioned for use in the particular body opening, and employing conventional techniques. They provide the added advantage of being mass-producible on an economic basis and being insertable into small body openings.

As the impedance of the design can be predicted with great accuracy, the appropriate tuning and matching circuit 12 elements can be calculated readily. If very low tolerance capacitors are employed, the values of the components and the tuning/matching circuit 12 need adjustment only during the initial design process. Once the design has been created, the coil assembly can be mass-produced with no tuning being required after manufacture.

It is known that most small size capacitors have high equivalent series resistance (ESR). When they are used in the miniaturized catheter coils of the present invention, it is preferred in order to have the desired high signal-to-noise ratio to have multiple parallel high ESR capacitors instead of employing just one tuning or matching capacitor in order to reduce the equivalent resistance overall. It is, therefore, preferable that capacitors 14, 16 in FIG. 1 each be comprised of multiple capacitive elements in order to achieve optimum coil performance. For example, the use of 5 parallel capacitive elements for each capacitor 14 and capacitor 16 produced increases in the quality factor of the coil 2 from about 7.5 to about 20. An alternate approach would be to employ as capacitive elements long, narrow and flexible sections of the printed circuit board itself, with the substrate of the printed circuit board serving as the dielectric of the capacitor. The capacitor selected will preferably have fixed values selected to tune the coil at the desired NMR frequency. The capacitor values may be selected initially and then the coil dimensions adjusted to achieve the desired NMR tuning frequency. This is accomplished by adjusting the inductance of the coil which depends on coil width, length, and number of turns. This can readily be accomplished by employing the circuit board method of manufacturing of the present invention. Once the proper size capacitors 14, 16 has been selected, this becomes the specification for use in the photolithographic technique employed in fabricating the inductor and capacitors. As a result, rapid, economical mass-production of the coils is permitted. Capacitors 14, 16 may be employed to match the printed coil to the coaxial cable 20, 26 (FIGS. 1, 1a, 1b) and produce a desired resistive load to the preamplifier 25. This load may be on the order of 50 ohms.

It will be appreciated that the coil assembly may be tuned to the desired MR frequency during manufacture by, prior to introducing the substrate into the catheter to create a catheter coil, adjusting at least one of the following: (a) the capacitive tuning means; and (b) the length of the conductive coil elements; and (c) the separation between adjacent coil elements.

Figure 2:
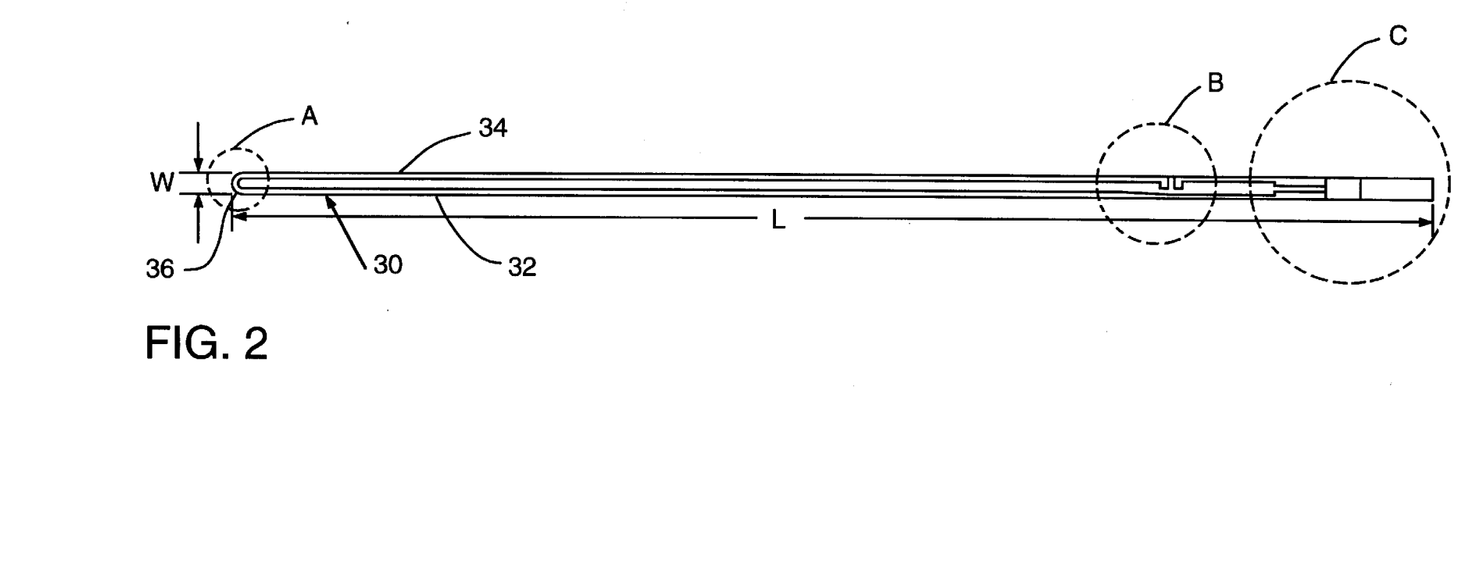
FIG. 2 is a schematic illustration of a single layer coil with passive tuning made by printed circuit board technology.

Referring to FIG. 2, there is shown a plan view of a coil formed on a flexible circuit board employing conventional grid and circuit technology. The coil 30 basically consists of a first coil portion 32 having a generally uniform width through at least a major portion of its extent, a second coil portion 34 oriented generally parallel to the first coil portion 32 and having a generally uniform width throughout at least a major portion of its extent, and an integrally formed electrically conductive connecting end portion 36. The overall coil length L may be about 1 to 30 cm. The average width of each coil portion 32, 34 may be about 0.05 to 5 cm. The average coil width W may be about 0.2 to 10 mm. The average thickness of the coil will be about 0.1 to 5 mm.

Figure 2A:
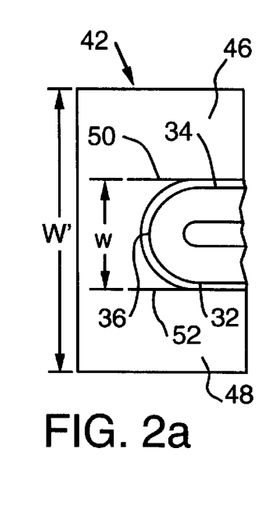
FIGS. 2a–2c are respectively enlargements of the circled portions of the coil of FIG. 2.

FIG. 2a is an enlarged version of the portion of the coil of FIG. 2 contained within dashed circle A. In the form shown, the circuit board 42 has a width W' substantially greater than width W of the coil, which width W' embraces both the width of the coil segments 32, 34, plus an additional increment of width due to portions 46, 48 of the underlying flexible circuit board substrate portion. In creating the coil as a separate usable element, the coil 30 will be severed from the circuit board 42 along generally parallel lines 50, 52 which leaves substrate borders 47, 49.

Figure 2B:
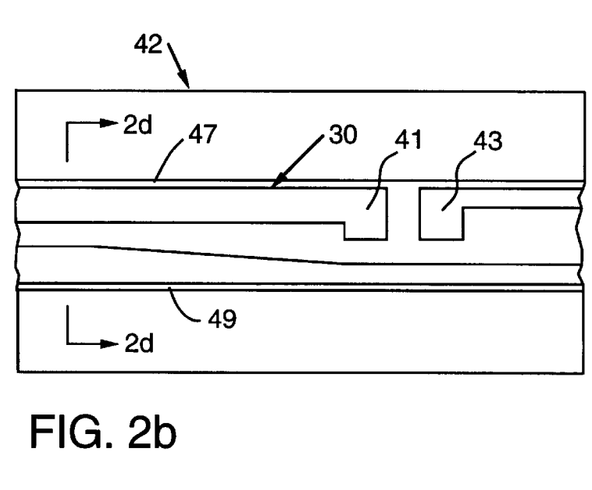
Figure 2C:
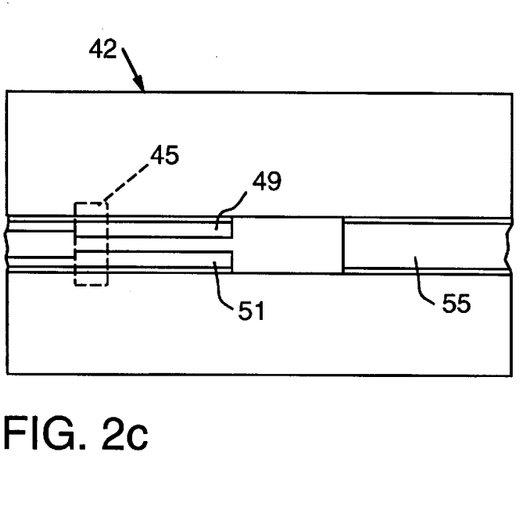

FIGS. 2b and 2c, respectively, are enlarged views of the portions of coil 30 of FIG. 2 contained within dashed circles B, C. FIG. 2a shows the end of the coil. Electrically conductive portions 32, 34, 36 of the coil 30 are printed on substrate 42.

FIG. 2b shows a section of the printed coil with pads 41, 43 for placement of capacitive element 14 (FIG. 1). FIG. 2c shows a portion of the printed coil with space 45 provided for capacitive element 16 (FIG. 1). The inner conductor of the coaxial cable 55 may be connected to coil 30 at 49 and the shield of the coaxial cable 47 may be connected to coil 30 at 51.

Figure 2D:
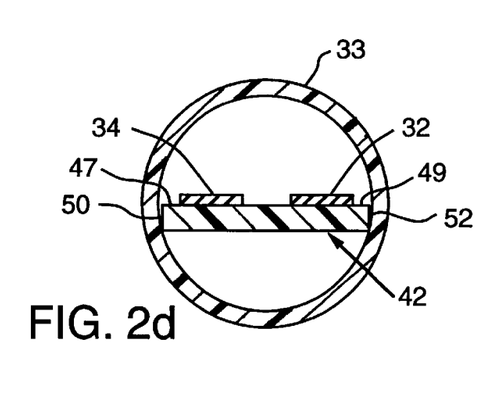
FIG. 2d is a cross-sectional illustration taken through 2d–2d of FIG. 2b showing a cross-section of the magnetic resonance coil of FIG. 2b contained within a suitable probe or catheter.

FIG. 2d shows the two parallel coil elements 32, 34 secured in overlying relationship to the flexible electrically insulative circuit board base 42 having lateral sides 50, 52. The assembly is conveniently provided in a suitable shroud 33 which may be in the form of a probe or catheter which is employed to introduce the coil assembly into a body opening. The probe or catheter may be provided with one or more lumens or longitudinal passageways, such as 604 of FIG. 12, for example, for guidewires insertion, contrast material injection, or other purposes. The catheter coil may have a generally circular cross-sectional configuration with a biocompatible resinous plastic covering the coil assembly and, if desired, one or more lumens or passageways formed within the resinous plastic and preferably being coextensive with the catheter.

FIGS. 3 through 6 show a single layer coil made on a flexible printed circuit board by conventional printed circuit means with copper being employed as the electrically conductive material. This coil has passive pickup tuning and active transmit detuning. The board design may be essentially the same as the design shown in FIGS. 1, 1a, and 1b except that a MOSFET is employed to provide a reliable and reproducible decoupling circuit. The MOSFET functions as an electronic switch to prevent the current from flowing on the coil during transmission of an RF pulse using an external coil. This design is easy to manufacture and does not require any adjustment during or after manufacture.

Figure 3:
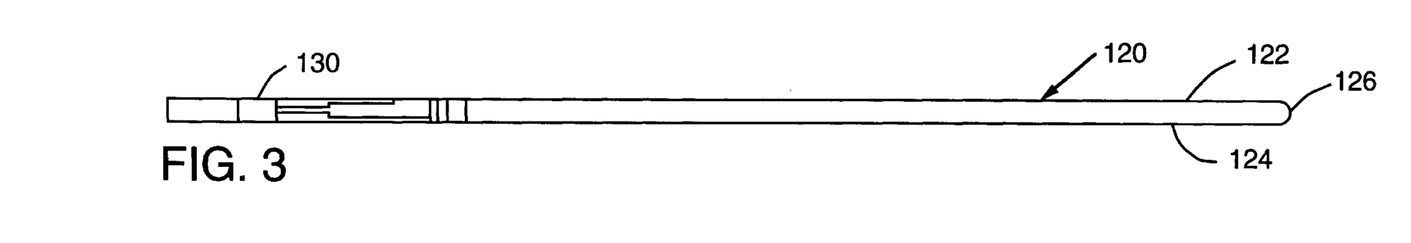
FIG. 3 is a schematic illustration of a single layer coil with passive tuning and active transmit detuning of the present invention.
Figure 4:
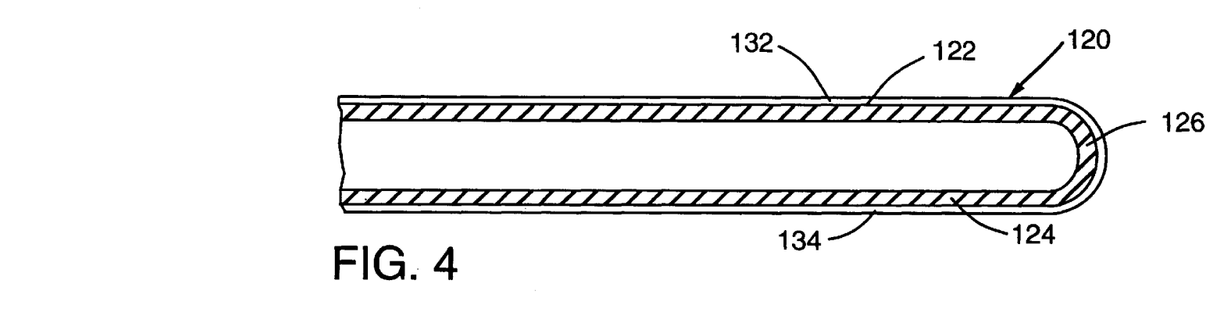
FIG. 4 is a fragmentary enlarged illustration of the right-hand portion of the coil of FIG. 3.
Figure 5:
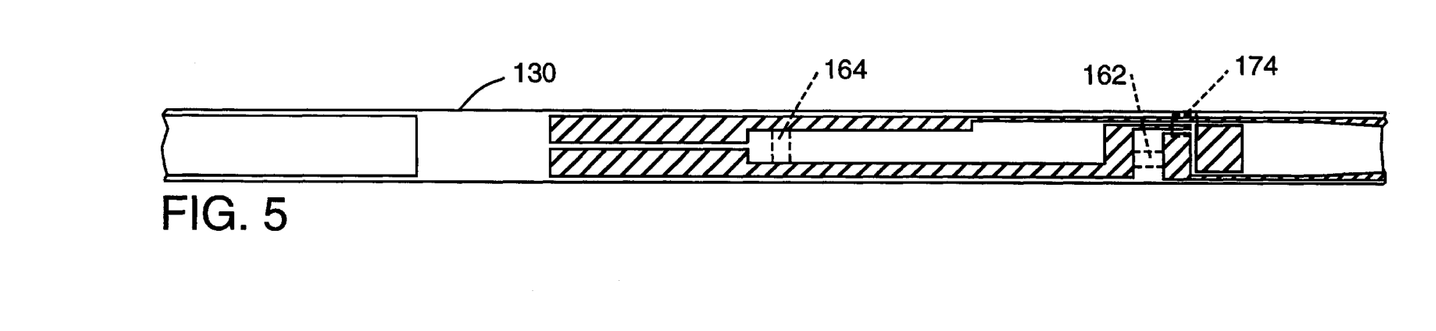
FIG. 5 is a fragmentary enlarged illustration of the left-hand portion of the coil of FIG. 3.

As shown in FIG. 3, the coil 120 has a first electrically conductive portion 122 of generally uniform width oriented generally parallel to a second electrically conductive portion 124 of generally uniform width with a connecting electrically conductive portion 126. Disposed exteriorly of the electrically conductive portions 122, 124, respectively, are portions of the electrically insulative circuit board 132, 134. FIG. 4 shows an enlarged detail of the right-hand end of coil 120 shown in FIG. 3. FIG. 5 shows an enlarged view of end portion 130 shown in the left-hand portion on FIG. 3.

Figure 6:
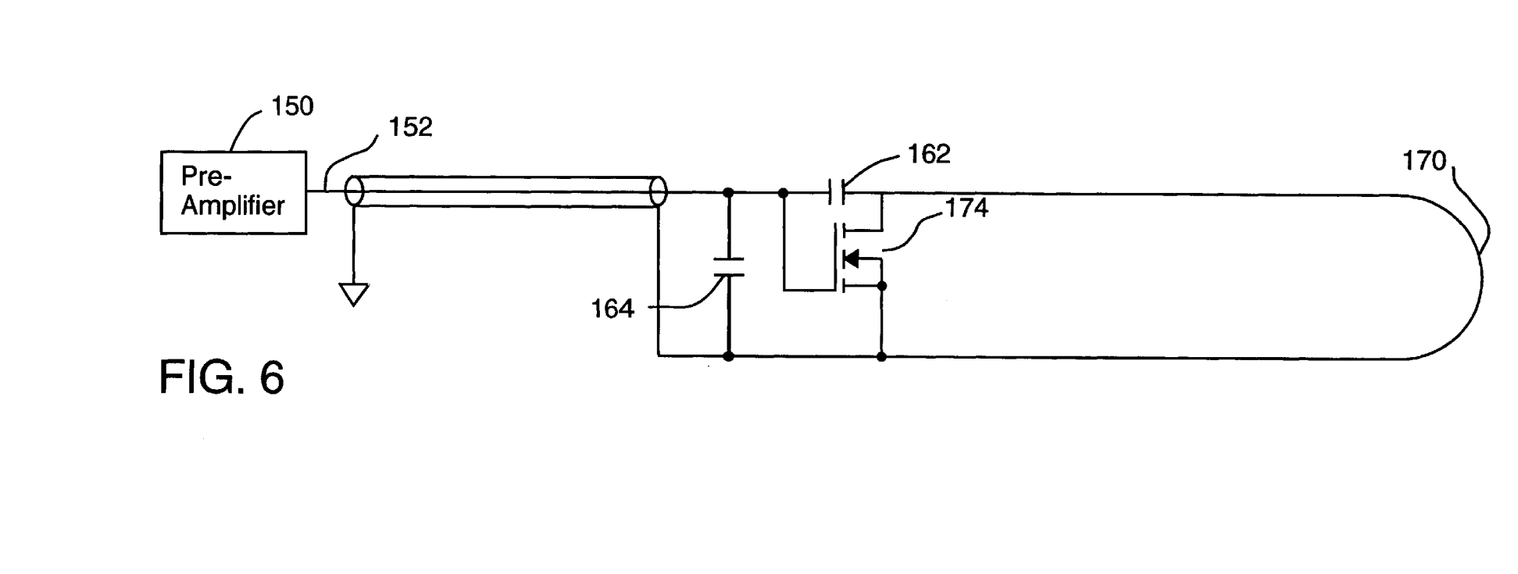
FIG. 6 is a schematic illustration of a single coil of the present invention with active transmit detuning.

FIG. 6 shows an embodiment with a circuit diagram which has a single coil with active transmit detuning. This circuit is employable with the printed circuit board shown in FIGS. 3 through 5. Referring to FIGS. 5 and 6, preamplifier 150 amplifies the received signal. The circuit contains capacitors 162 and 164, inductive coil 170 and a MOSFET 174. The MOSFET 174, which preferably is an N-channel enhancement mode MOSFET, may be used to short the pickup inductor coil 170.

Figure 7:
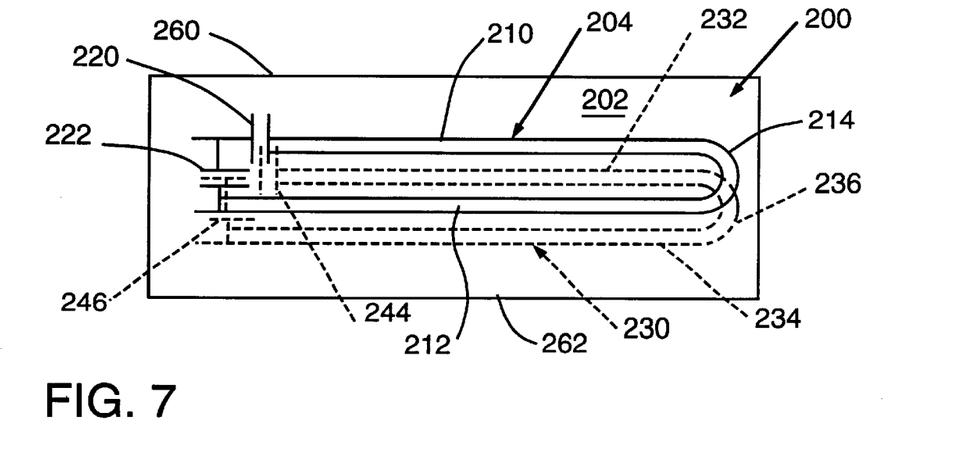
FIG. 7 is a circuit diagram of a quadrature coil design employed on two sides of the printed circuit board substrate.

In another embodiment of the present invention, miniaturized coils may be provided employing two pairs of coils. The use of two pairs of coils was disclosed in U.S. Pat. No. 5,699,801, the disclosure of which is expressly incorporated herein with reference, for example, to FIGS. 7 and 8 thereof. In employing the printed circuit board technology of the present invention, to accomplish this objective, the quadrature structure is so provided that each of the two pairs of coils will be so oriented with respect to each other that their mutual inductance will be zero. This arrangement eliminates the need to align the pickup coil along the main magnetic field of the magnetic resonance scanner. In establishing the assembly, the flexible circuit board has a first pair of electrically connected coils established on one side of the flexible circuit board and an offset second pair of electrically connected coils established on the other side of the circuit board. With reference to FIG. 7, an electrically insulative generally rectangular flexible circuit board 200 has a first surface 202 on which an electrically conductive path containing a first coil 204 consisting of a first coil segment 210, a generally parallel second coil segment 212, and an end electrically connecting portion 214 are provided. A first capacitor 220 and a second capacitor 222 are provided in the circuit. On the other side of the board 200, a second coil laterally offset from the first coil by dotted line capacitors 244, 246 are provided. By effecting relative closing movement of the edges 260, 262 of electrically insulative board 202 in a direction downwardly into the page, the structure of FIG. 8 may be created. The board may be embedded into a resinous plastic material or introduced into a catheter to create a catheter coil or may be secured in the position of FIG. 8 by other suitable means, such as glue, for example. The capacitors 220, 222, 244, 246 may be separate electrical components secured to the board in electrical continuity with the coils. The outer conductors 210, 212 are generally diametrically opposed from each other and the inner conductors 230, 232 are generally diametrically opposed to each other with a line diametrically connecting conductors 210, 212 being generally perpendicular to a line diametrically connecting conductors 230, 232.

Figure 8:
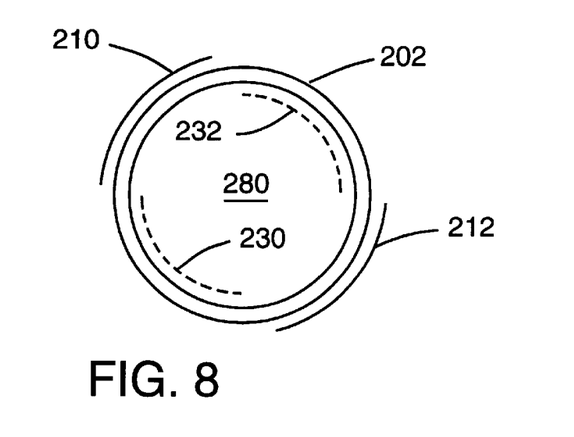
FIG. 8 is an illustration of the circuit board of FIG. 7 rolled so as to provide two loops which are perpendicular to each other.

The decoupling methods, such as using a PIN diode, MOSFET, or RF current cancellation can be used on each of the quadrature coils shown in FIGS. 7 and 8. FIG. 1 shows a PIN diode device 22 for decoupling when the coil is employed in a receive-only mode. In the event that the decoupling circuit is eliminated, the catheter coil will tend to distort the RF magnetic field during the transmit pulse by the external coil. It is, therefore, appropriate to provide a means for decoupling the external coil from the catheter coil during RF transmission in the receive-only mode. In this mode, an external coil is employed to transmit. If the coil is to function in the transmit/receive mode, the decoupling circuit is not needed.

Figure 9:
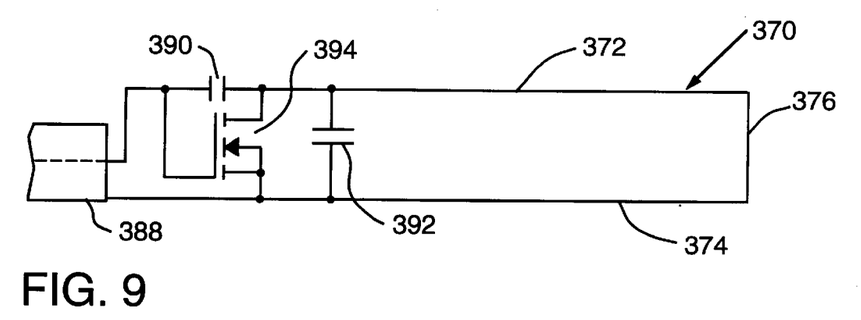
FIG. 9 is a circuit diagram of an alternative single layer coil with passive tuning and active decoupling circuit.

With reference to FIG. 9, a means for tuning the decoupling element is disclosed. Coil 370 has electrically connected portions 372, 374, 376. The coaxial cable 381 is operatively associated with circuit has a first capacitor 390, a second capacitor 392, an N-channel enhancement mode, and MOSFET 394 positioned to short circuit the tuning capacitor 392 thereby reducing the Q of the coil substantially. This occurs when a positive DC bias is supplied by the scanner hardware. This will serve to decrease the induced current on the coil to a desired very low level. When the DC bias is negative or zero, the MOSFET 394 behaves like an open circuit and, therefore, does not affect the tuning and matching. This properly may be employed to decouple the coil from the external coil during RF transmission.

Figure 10:
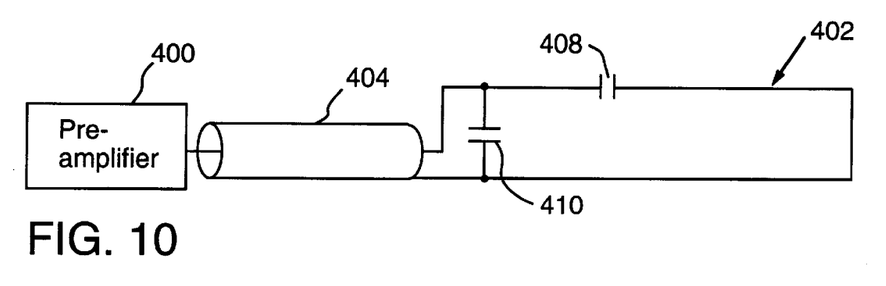
FIG. 10 illustrates a transmit/receive coil having receive-only capabilities.

Another embodiment of the invention, shown in FIG. 10, involves the application of an RF current to the catheter coil with the opposing phase to the transmit coil during RF transmission to cancel any induced current in the catheter coil. In this embodiment, a transmit/receive coil 402 (which has no decoupling circuit) is employed in a receive-only mode. The circuit is shown in FIG. 10 wherein a preamplifier 400 emits an amplified signal through coaxial cable 404 to coil 402 which has capacitors 408, 410. No additional circuit for the catheter coil is required. Tuning of the pulse sequence before imaging would be involved. The procedure for such tuning would involve applying a very weak RF power to the body coil (not shown) while the catheter coil is used for receiving the signal. The ratio of the signal received by the catheter coil to the applied RF signal is calculated. The phase difference between the applied RF pulse and the catheter coil received RF signal is calculated. The RF signal is applied to the catheter coil with the opposing phase and the same amplitude ratio with the RF pulses applied to the transmit coil during the MR imaging sequence. This serves to cancel the induced currents on the catheter coil. The advantage of this method is that it does not require any decoupling circuit and, therefore, no tuning is necessary during the manufacturing process. If desired, the catheter coil can be transformed to a transmit coil by turning off the RF power applied to the external coil. This approach is particularly useful in the implementation of cylindrical encoding procedures such as disclosed in U.S. patent application Ser. No. 08/979,121, entitled "Method of Magnetic Resonance Analysis Employing Cylindrical Coordinates and an Associated Apparatus," which has some common inventors with the present application.

Figures 11, 12:
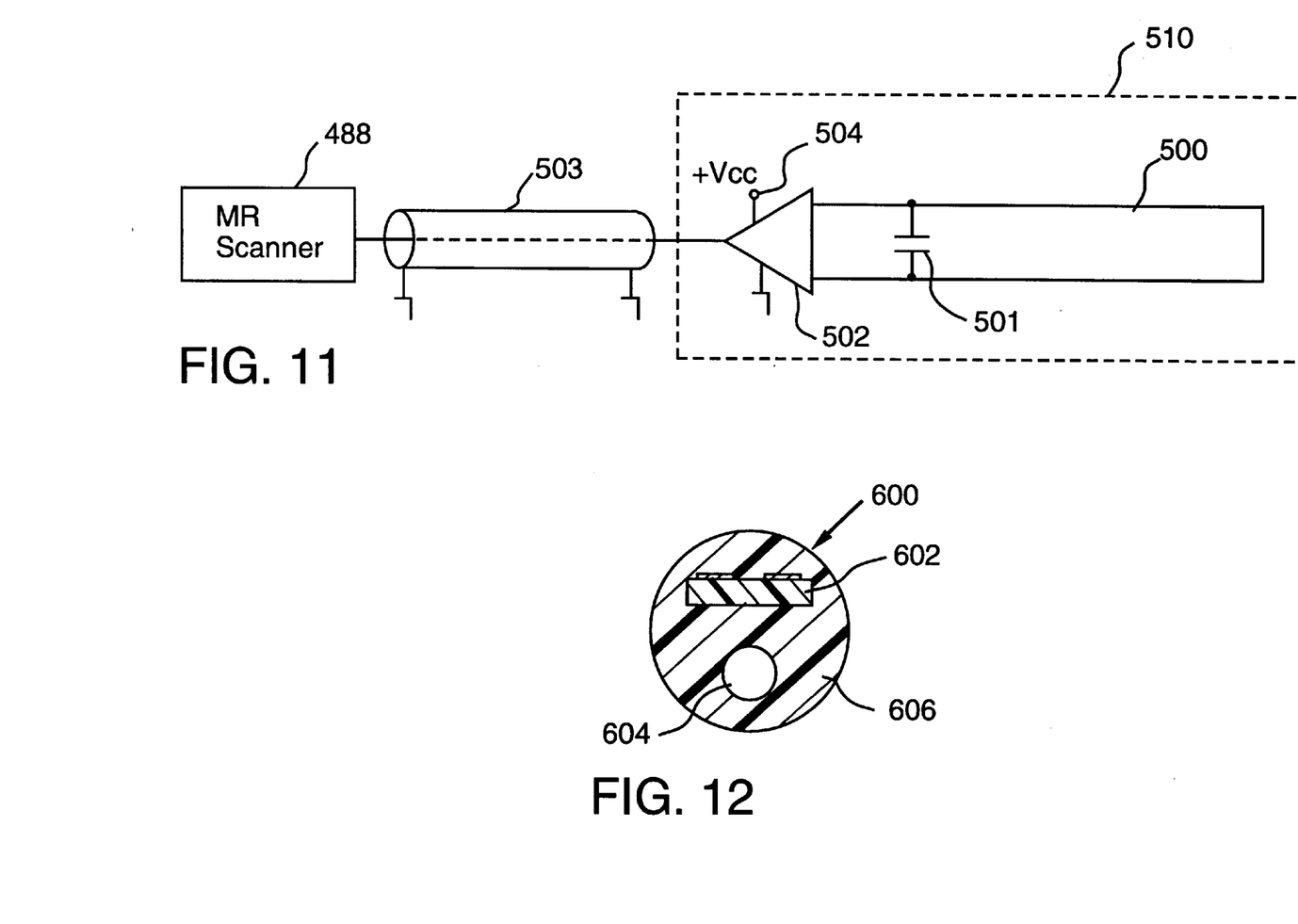
FIG. 11 is a circuit diagram of an embodiment having a built-in preamplifier.
FIG. 12 is a schematic cross-sectional illustration of a form of catheter coil of the present invention.

Referring to FIG. 11, an embodiment of the present invention, wherein the catheter coil 500 has a built-in preamplifier, will be considered. An MR scanner 488 is operatively associated with coaxial cable 503. Coil 500, a tuning element which is shown as capacitor 501 and preamplifier 502 are all positioned within a catheter 510. The supply voltage and Vcc to operate the preamplifier 502 may be supplied by another cable from the MR scanner (not shown). If desired, a decoupling circuit can be incorporated into this embodiment to resist current induction in the coil during transmission with an external coil.

FIG. 12 shows a cross-sectional illustration of a catheter coil 600 of the present invention wherein the coil assembly 602 is embedded in a biocompatible resinous material 606 of generally cylindrical shape. A lumen 604, which may be coextensive with the catheter coil 600, has been provided for receipt of a guidewire (not shown). It will be appreciated that the catheter coil may be created by inserting the coil assembly 602 into a preformed catheter or by providing molten resinous material around the coil assembly 602 as by extrusion, coating or molding, for example.

It will be appreciated, therefore, that the present invention has provided a means for creating miniaturized coil assemblies for use in magnetic resonance imaging and spectrographic analysis with the coils being created by the use of the printed circuit board which can be introduced into a technology. The coil assemblies are of sufficiently small size as to be readily received within a catheter to create a catheter coil which can be introduced into a patient including body openings, including small body openings, such as small blood vessels. All of this is accomplished in a manner which is compatible with existing magnetic resonance imaging and spectrographic systems, including the magnetic field generating means, the RF pulse generating means, the microprocessor means, and all of the related system component and procedures. The coils may be disposable.

In general, the printed circuit board will have a thickness including any projection of the electrically conductive portion of less than about 0.1 to 10 mm.

It will be appreciated that a plurality of coils each having a pair of coil elements which are electrically connected may be created on a single substrate with individual coils comprising a pair of electrically connected coil elements and a supporting substrate may be severed from the remainder of the coils to create individual coils.

Whereas particular embodiments of the present invention have been described herein for purposes of illustration, it will be appreciated by those skilled in the art that numerous variations of the details may be made without departing from the invention as described in the appended claims.

We claim:

1. A method of making a magnetic resonance catheter coil comprising:

providing a flexible circuit board having a first outer surface;

forming electrically conductive material on said first outer surface of said circuit board into a first coil element having a length and a width;

forming electrically conductive material on said first outer surface of said circuit board into a second coil element, said second coil element having a length and a width and positioned substantially parallel to, and a distance from, said first coil element;

forming electrically conductive material on said first outer surface of said circuit board to form a connector portion joining said first coil element and said second coil element, the combination of said first coil element and said second coil element and said connector portion constituting a first magnetic resonance coil; and covering said magnetic resonance coil and said circuit board to provide said magnetic resonance catheter coil.

2. The method of claim 1 including severing a portion of said circuit board upon which said first magnetic resonance coil was formed to create a first unitary coil assembly.

3. The method of claim 2 including forming a second magnetic resonance coil on a circuit board, said second magnetic resonance coil comprising a third coil element and a fourth coil element substantially parallel to said third coil element and a second connector portion joining said third coil element to said fourth coil element;

severing a portion of said circuit board upon which said second magnetic resonance coil was formed to create a second unitary coil assembly;

arranging said first unitary coil assembly and said second unitary coil assembly such that the plane including said first coil element and said second coil element is perpendicular to the plane including said third coil element and said fourth coil element.

4. The method of claim 1 including forming a plurality of said magnetic resonance coils on said circuit board, and severing individual coils therefrom.

5. The method of claim 1 including creating said magnetic resonance coil with an average width of about 0.2 to 10 mm.

6. The method of claim 5 including creating said magnetic resonance coil with a thickness of about 0.1 to 10 mm.

7. The method of claim 6 including creating said magnetic resonance coil with a length of about 1 to 30 cm.

8. The method of claim 1 including forming a second magnetic resonance coil on said circuit board, said second magnetic resonance coil comprising a third coil element and a fourth coil element substantially parallel to said third coil element and a second connector portion joining said third coil element to said fourth coil element.

9. The method of claim 8 including forming said first magnetic resonance coil in a position which is relatively offset from said second magnetic resonance coil.

10. The method of claim 8 including deforming said circuit board into a substantially cylindrical shape.

11. The method of claim 8 including deforming said circuit board so that a line drawn substantially perpendicular to said first coil element and said second coil element will be oriented substantially perpendicularly with respect to a line drawn substantially perpendicular to said third coil element and said fourth coil element.

12. The method of claim 11 including deforming said circuit board so that the plane including said first coil element and said second coil element will be oriented substantially perpendicularly to the plane including said third coil element and said fourth coil element.

13. The method of claim 12 including said first coil element being aligned substantially parallel to said fourth coil element.

14. The method of claim 8 including forming said second magnetic resonance coil so that a line drawn substantially perpendicular to said first coil element and said second coil element will be oriented substantially parallel with respect to a line drawn substantially perpendicular to said third coil element and said fourth coil element.

15. The method of claim 8 including forming said second magnetic resonance coil on an opposing outer surface of said circuit board to said first magnetic resonance coil.

16. The method of claim 15 including deforming said circuit board to establish a tubular coil structure having said first magnetic resonance coil along the exterior surface thereof and said second magnetic resonance coil along the interior surface thereof.

17. The method of claim 16 including creating said tubular coil structure with each exterior coil element having an interior said coil element interposed circumferentially between it and the next adjacent exterior coil element.

18. The method of claim 16 including
establishing said tubular coil structure such that a line drawn substantially perpendicular to said first coil element and said second coil element will be oriented substantially perpendicularly with respect to a line drawn substantially perpendicular to said third coil element and said fourth coil element.

19. The method of claim 1 including
creating a decoupling circuit in electrical communication with said first magnetic resonance coil.

20. The method of claim 19 including
electrically interposing a tuning/matching circuit between said first magnetic resonance coil and said decoupling circuit.

21. The method of claim 19 including
providing at least two capacitors in said coil.

22. The method of claim 21 including
providing an electronic switch operatively associated with at least one said capacitor.

23. The method of claim 1 including
employing a preformed catheter in effecting said covering.

24. The method of claim 1 including
creating said catheter by applying a molten resinous material to effect said covering.

25. The method of claim 1 including
establishing capacitive tuning means on said circuit board.

26. The method of claim 25 including
tuning the magnetic resonance coil to a desired MR frequency by adjusting at least one of the following: (a) said capacitive tuning means; and (b) the length of said first coil element and said second coil element; (c) the distance said second coil element is from said first coil element.

27. The method of claim 25 including
establishing said capacitive tuning means by electrodeposition on said circuit board.

28. The method of claim 25 including
employing said method to create a capacitive magnetic resonance coil.

29. The method of claim 25 including
employing said method to create a transmitting magnetic resonance coil.

30. The method of claim 25 including
employing said method to create a transmitting and receiving magnetic resonance coil.

31. The method of claim 1 wherein said forming comprises etching.

32. The method of claim 1 wherein said forming comprises electroplating.

33. The method of claim 1 wherein said forming includes providing electrically conductive inks.

34. The method of claim 1 wherein said forming includes forming said first coil element with substantially uniform width.

35. A magnetic resonance catheter coil system comprising:
a catheter, said catheter having disposed therein
a flexible circuit board having a first outer surface with a first magnetic resonance coil formed thereon, said first magnetic resonance coil including,
a first coil element formed of electrically conductive material,
a second coil element formed of electrically conductive material and positioned substantially parallel to said first coil element,
a connector portion formed of electrically conductive material and joining
said first coil element and said second coil element.

36. The coil of claim 35 including
said circuit board substantially underlying said coil elements to create a unitary coil assembly.

37. The coil of claim 35 including
a plurality of magnetic resonance coils formed on said circuit board.

38. The coil of claim 35 including
said coil having an average width of about 0.2 to 10 mm.

39. The coil of claim 38 including
said coil having a thickness of about 0.1 to 5 mm.

40. The coil of claim 39 including
said coil having a length of about 1 to 30 cm.

41. The coil of claim 35 including
a second magnetic resonance coil formed on said circuit board, said second magnetic resonance coil comprising a third coil element and a fourth coil element substantially parallel to said third coil element and a second connector portion joining said third coil element to said fourth coil element.

42. The coil of claim 41 including
said second magnetic resonance coil being formed so that a line drawn substantially perpendicular to said first coil element and said second coil element will be oriented substantially parallel with respect to a line drawn substantially perpendicular to said third coil element and said fourth coil element.

43. The coil of claim 41 including
said circuit board being deformed so that a line drawn substantially perpendicular to said first coil element and said second coil element will be oriented substantially perpendicularly with respect to a line drawn substantially perpendicular to said third coil element and said fourth coil element.

44. The coil of claim 43 including
said circuit board being deformed so that the plane including said first coil element and said second coil element will be oriented substantially perpendicularly to the plane including said third coil element and said fourth coil element.

45. The coil of claim 44 including
said first coil element being aligned substantially parallel to said fourth coil element.

46. The coil of claim 41 including
said circuit board being deformed into a substantially cylindrical shape.

47. The coil of claim 41 including
said first magnetic resonance coil being in a position which is relatively offset from said second magnetic resonance coil.

48. The coil of claim 41 wherein
said second magnetic resonance coil is formed on an opposing outer surface of said circuit board relative to said first magnetic resonance coil.

49. The coil of claim 48 including
said circuit board being deformed into a tubular coil having said first magnetic resonance coil formed on the exterior surface thereof and said second magnetic resonance coil formed on the interior surface thereof.

50. The coil of claim 49 including said tubular coil having a design such that a line drawn substantially perpendicular to said first coil element and said second coil element is oriented substantially perpendicularly with respect to a line drawn substantially perpendicular to said third coil element and said fourth coil element.

51. The coil of claim 49 including said tubular coil with each exterior coil element having an interior said coil element interposed circumferentially between it and the next adjacent coil element.

52. The coil of claim 35 including said first magnetic resonance coil being a capacitive magnetic resonance coil.

53. The coil of claim 35 including said first magnetic resonance coil being a transmitting magnetic resonance coil.

54. The coil of claim 35 including said first magnetic resonance coil being a transmitting and receiving magnetic resonance coil.

55. The coil of claim 35 including a decoupling circuit disposed in electrical connection with said first magnetic resonance coil.

56. The coil of claim 55 including a tuning/matching circuit electrically interposed between said first magnetic resonance coil and said decoupling circuit .

57. The coil of claim 55 including at least two capacitors.

58. The coil of claim 57 including an electronic switch operatively associated with at least one said capacitor.

59. The coil of claim 35 including a preamplifier electrically disposed within said catheter and being connected to said first magnetic resonance coil.

60. The coil of claim 35 including a preamplifier electrically connected to said first magnetic resonance coil and secured to said circuit board.

61. The coil of claim 35 including said catheter being a preformed catheter.

62. The coil of claim 35 including said catheter being created by applying a molten resinous material to said circuit board and said first magnetic resonance coil.

63. The coil of claim 35 further including capacitive tuning means.

* * * * *